(12) United States Patent
Atsumi et al.

(10) Patent No.: US 6,570,455 B2
(45) Date of Patent: May 27, 2003

(54) RUBIDIUM ATOM OSCILLATOR GENERATING A STABLE FREQUENCY

(75) Inventors: Ken Atsumi, Sapporo (JP); Hideyuki Matsuura, Sapporo (JP); Yoshifumi Nakajima, Sapporo (JP); Yoshito Koyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/965,171

(22) Filed: Sep. 27, 2001

(65) Prior Publication Data

US 2002/0125959 A1 Sep. 12, 2002

(30) Foreign Application Priority Data

Mar. 8, 2001 (JP) ........................................ 2001-064261

(51) Int. Cl.$^7$ ................................................ H03L 7/26
(52) U.S. Cl. .......................................... 331/3; 331/94.1
(58) Field of Search ..................... 331/3, 94.1; 327/116; 324/305

(56) References Cited

U.S. PATENT DOCUMENTS

| | | | | |
|---|---|---|---|---|
| 4,425,515 A | * | 1/1984 | Larson | 327/116 |
| 4,661,782 A | * | 4/1987 | Weidemann | 324/305 |
| 5,606,291 A | * | 2/1997 | Verbanets | 331/3 |
| 6,133,800 A | * | 10/2000 | Deng | 331/3 |
| 6,300,841 B1 | * | 10/2001 | Atsumi et al. | 331/3 |

FOREIGN PATENT DOCUMENTS

| | | |
|---|---|---|
| JP | 07131343 | 5/1995 |
| JP | 08307259 | 11/1996 |
| JP | 08340254 | 12/1996 |

* cited by examiner

Primary Examiner—Robert Pascal
Assistant Examiner—Joseph Chang
(74) Attorney, Agent, or Firm—Katten Muchin Zavis Rosenman

(57) ABSTRACT

A rubidium atom oscillator is not influenced by a circumference noise or the like, and is excellent in the short-term stability and the phase noise characteristic. A crystal oscillator oscillates a fixed frequency as an atomic resonance frequency. A direct digital synthesizer inputs an output of the crystal oscillator as a system clock and also inputs tuned data corresponding to an error signal generated according to a resonance frequency so as to carry out a variable control of an output frequency. A frequency synthesizer synthesizes and multiplies an output of the direct digital synthesizer and applies a phase modulation with a low-frequency signal. An atomic resonator inputs an output of the frequency synthesizer and detects an error signal with respect to a resonance frequency of rubidium atoms. A tuned-data generating circuit inputs the error signal from the atomic resonator so as to generate the tuned data corresponding to the error signal. The output frequency of the direct digital synthesizer is output from the rubidium atom oscillator.

9 Claims, 11 Drawing Sheets

RUBIDIUM ATOM OSCILLATOR GENERATING A STABLE FREQUENCY

BACKGROUND OF THE INVENTION

1. Field of the Invention

The present invention generally relates to rubidium atom oscillators and, more particularly, to a rubidium atom oscillator used for a reference frequency source for broadcasting, a clock source established in a subordinate office of a lower part of a main office which constitutes a digital synchronous network or a clock source provided in a base station of mobile communications.

In recent years, in the market of a source of reference frequency, there is a demand for a small, low cost, high performance rubidium atom oscillator. In order to realize a rubidium atom oscillator that satisfies such requirements, simplification of circuits and selection of low cost parts of a rubidium atom oscillator are advanced. Consequently, as for a voltage controlled crystal oscillator (VCXO) used as a slave oscillator, a small general-purpose rubidium atom oscillator having a large manufacturing deviation and a large degradation of an output frequency has been used. Accordingly, it is desired to make an improvement with respect to stability in frequency or influence of circumference noise.

2. Description of the Related Art

FIG. 1 shows a composition of a conventional rubidium atom oscillator. The rubidium atom oscillator shown in FIG. 1 comprises: a voltage controlled crystal oscillator (VCXO) 80 which oscillates a frequency of about 10 MHz; a frequency synthesis part 81; a low-frequency oscillator 82; an atomic resonator 83 which uses rubidium atoms; a preamplifier 84; a synchronous wave detector 85; an alarm (ALM) circuit 86 which generates an alarm when a resonance signal output from the preamplifier 84 is not detected; a sweep circuit 87 which generates a sweep waveform to VCXO 80; a switching circuit 88 which is controlled by an output of the alarm circuit 86 so as to select a synchronized signal from the synchronous wave detector 85 when an alarm output is detected and to select a sweep signal from the sweep circuit 87 when the alarm output is not detected; and an integrator 89 which integrates the output of the switching circuit 88 so as to generate a control voltage for VCXO 80.

A description will now be given of an operation of the above-mentioned rubidium atom oscillator. An output of VCXO 80 is supplied to outside as an output (Rb-OSC) of the rubidium atom oscillator, and also supplied to the frequency synthesis part 81. The frequency synthesis part 81 synthesizes and multiplies the output frequency of VCXO 80 so as to generate the atomic resonance frequency (6.8346282 . . . GHz). Moreover, the frequency synthesis part 81 performs phase modulation by an output signal of the low-frequency oscillator 82. The low-frequency oscillator 82 oscillates a frequency of 100–200 Hz. The output of the frequency synthesis part 81 is supplied to the atomic resonator 83.

FIG. 2 shows the internal composition of the atomic resonator 83. As shown in FIG. 2, the atomic resonator 83 includes: a magnetic shield case 83' accommodating the atomic resonator; a lamp house 830 accommodating a rubidium lamp 832; a high-frequency source 831; a cavity 833 which constitutes a cavity resonator; a resonance cell 834 in which rubidium atoms (gas) are filled; a photodiode 835 which detects a rubidium light; and a microwave excitation antenna 836.

An atomic resonator is accommodated in the magnetic shield case 83'. The lamp house 830 and the cavity 833 are temperature-controlled at 90 degrees and 70 degrees, respectively. The rubidium lamp 832 provided inside the lamp house 830 emits a light by electrodeless discharge caused by high-frequency excitation of rubidium atoms (gas) being carried out by the high-frequency source 831. The cavity 833 is tuned to the atomic resonance frequency (=6.8346 . . . GHz), and the microwave output from the frequency synthesis part 81 (refer to FIG. 1) is emitted from the microwave excitation antenna 836. The microwave is irradiated to the rubidium atom enclosed in the resonance cell 834. The photodiode 835 detects the light of the rubidium lamp 832 which passed through the resonance cell 834. If the frequency of the microwave irradiated to the rubidium atoms matches the resonance frequency of rubidium atom, an amount of light received by the photodiode decreases due to a light-microwave double resonance, thereby, generating a resonance signal (a reduction in the amount of light is regarded as a detection of a resonance signal).

Returning to FIG. 1, the preamplifier 84 amplifies the output of the photodiode 835. The amplified output is supplied to the synchronous wave detector 85 as an atomic resonance output, and also supplied to the alarm circuit 86. Based on existence of the resonance signal in the output of the atomic resonator 83, the alarm circuit 86 distinguishes the states of frequency lock and unlock, and outputs an alarm signal to outside. The switching circuit 88 switches the signal to be supplied to the integrator 89 according to the alarm signal. That is, the switching circuit 88 selects the output of the synchronous wave detector 85 in a non-alarm state in which the resonance signal is detected. On the other hand, the switching circuit 88 selects an output of the sweep circuit 87 which generates a voltage which carries out the sweep of the output frequency of VCXO 80 in a state in which the resonance signal has not been detected. The output of the switching circuit 88 is supplied to the integrator 89. The integrator 89 integrates the input signal, and changes the input signal into a control signal.

The synchronous wave detector 85 carries out synchronous detection of the resonance signal generated by the atomic resonator 83 by the output frequency of the low-frequency oscillator 82, i.e., the same frequency as the phase modulation in the frequency synthesis part 81. The integrator 89 smoothes the output of the switching circuit 88 into a direct-current signal, and outputs the directcurrent signal as an error signal. By applying the error signal output from the integrator 89 to VCXO 80 as a frequency control voltage, the output frequency of VCXO 80 is kept equal to the resonance frequency of rubidium atoms with respect to stability of frequency (a frequency lock is carried out).

As mentioned above, VCXO is used for the conventional rubidium atom oscillator. Since VCXO enables a frequency variable by an external control voltage, a change in the frequency of VCXO, which is caused by a change in an outside environment, such as temperature, a power supply, and noise, or aging, is large as compared with the crystal oscillator (XO) of a fixed frequency output. Such a characteristic change is especially large in a general-purpose small VCXO that has come to be used in recent years. FIG. 3 is a graph showing changes in the characteristics of VCXO and XO with passage of time. In FIG. 3, a horizontal axis expresses lapsed days (day), and a vertical axis expresses a rate of change in frequency ($\Delta f/f_0$). $\Delta f$ is a change in frequency and $f_0$ is a basic frequency of crystal oscillators. It can be appreciated from the graph of FIG. 3 that the change in the characteristic of VCXO with the passage of time is larger than that of XO.

In order to correct such a frequency change and aging of VCXO, generally, a more steep frequency variable characteristic is given to VCXO. For this reason, the frequency stability of VCXO tends to be influenced by a circumference noise, etc. Therefore, when a rubidium atom oscillator is constituted using VCXO, there is a problem in that VCXO becomes a major cause of a characteristic degradation such as degradation in the short-term stability (a rate of stabilization within a short time) of a rubidium atom oscillator or phase noise degradation (instability due to phase change).

Furthermore, since an amount of change with the passage of time is large, the frequency of VCXO is swept during a period (about 10–30 minutes) until a frequency lock is carried out at the time of starting or when it becomes impossible to detect the resonance signal due to a certain failure, i.e., at the time of alarming a frequency unlock. FIG. 4 is a graph showing the frequency change at the time of alarming and a frequency lock. In FIG. 4, a horizontal axis expresses time, and a vertical axis expresses a rate of change in frequency ($\Delta f/f_0$). As shown in FIG. 4, at the time of starting and occurrence of a failure, the modulation sensitivity of VCXO with respect to the sweep voltage is large in the alarming state (non-detection state of the resonance signal). Therefore, the frequency changes sharply and the frequency is locked in the non-alarming state (detection state of the resonance signal). Thus, there is a problem in that the frequency stability of a rubidium atom oscillator deteriorates remarkably at the time of alarming.

SUMMARY OF THE INVENTION

It is general object of the present invention to provide an improved and useful rubidium atom oscillator in which the above-mentioned problems are eliminated.

A more specific object of the present invention is to provide a rubidium atom oscillator which is not influenced by a circumference noise or the like, and is excellent in the short-term stability and the phase noise characteristic.

Another object of the present invention is to provide a rubidium atom oscillator which can minimize degradation in the frequency stability in a frequency unlock state.

In order to achieve the above-mentioned objects, there is provided according to one aspect of the present invention a rubidium atom oscillator comprising: a crystal oscillator which oscillates a fixed frequency as an atomic resonance frequency; a direct digital synthesizer which inputs an output of the crystal oscillator as a system clock and also inputs tuned data corresponding to an error signal generated according to a resonance frequency so as to carry out a variable control of an output frequency; a frequency synthesizer which synthesizes and multiplies an output of the direct digital synthesizer and applies a phase modulation with a low-frequency signal; an atomic resonator which inputs an output of the frequency synthesizer and detects an error signal with respect to a resonance frequency of rubidium atoms; a tuned-data generating circuit which inputs the error signal from the atomic resonator so as to generate the tuned data corresponding to the error signal, wherein the output frequency of the direct digital synthesizer is output from the rubidium atom oscillator.

In the rubidium atom oscillator according to the present invention, the tuned-data generating circuit may include a data adder which inputs and sums a digital signal corresponding the error signal from the atomic resonator and an output signal of an erasable programmable read only memory that stores the tuned data output to the direct digital synthesizer so as to output the tuned data in which the error signal is reflected.

Additionally, the rubidium atom oscillator according to the above-mentioned invention may further comprise a temperature correction circuit which generates a temperature correction signal for correcting a change in the resonance frequency of the atomic resonator based on a temperature detection signal representing a circumference temperature of the atomic resonator, wherein the temperature correction signal is input to the data adder of the tuned-data generating circuit.

Alternatively, the rubidium atom oscillator according to the present invention may further comprise a temperature correction circuit which generates a temperature correction signal for correcting a change in the resonance frequency of the atomic resonator based on a temperature detection signal corresponding to a collector voltage of a transistor which controls an electric current supplied to a heater provided in the atomic resonator, wherein the temperature correction signal is input to the data adder of the tuned-data generating circuit.

Additionally, the rubidium atom oscillator according to the present invention may further comprise a light amount correction circuit which generates a light amount correction signal for correcting a change in the resonance frequency of the atomic resonator based on a light amount detection signal representing a change in an amount of light of a rubidium lamp provided in the atomic resonator with respect of passage of time, wherein the temperature correction signal is input to the data adder of the tuned-data generating circuit.

In the rubidium atom oscillator according to the present invention, the data adder may input a signal representing a variable control voltage from outside so that the tuned data output from the tuned-data generating circuit is variable to change the oscillation frequency of the rubidium atom oscillator.

The rubidium atom oscillator according to the above-mentioned invention may further comprise an analog-to-digital converter which converts the signal representing the variable control voltage into a digital signal and supplies the digital signal to the data adder.

The signal representing the variable control voltage may be a digital signal so that the digital signal is directly supplied to the data adder.

Additionally, there is provided according to another aspect of the present invention a rubidium atom oscillator comprising: a crystal oscillator which oscillates a fixed frequency as an atomic resonance frequency; a direct digital synthesizer which inputs an output of the crystal oscillator as a system clock and also inputs control data corresponding to an error signal generated according to a resonance frequency so as to carry out a variable control of an output frequency; an atomic resonator which inputs an output of the direct digital synthesizer after being subjected to a predetermined process and detects an error signal with respect to a resonance frequency of rubidium atoms; a control-data generating circuit which inputs the error signal from the atomic resonator so as to generate the control data corresponding to the error signal, wherein the output frequency of the direct-digital synthesizer is output from the rubidium atom oscillator.

According to the present invention, the rubidium atom oscillator can be constituted using the crystal oscillator having a fixed frequency output, as a source of generation of an atomic resonance frequency, which cannot be easily influenced by a circumference noise or the like. Thereby, the rubidium atom oscillator excellent in the phase noise characteristic and frequency short-term stability of an output can be achieved.

Moreover, since the crystal oscillator does not have any frequency variable element and an output frequency deviation and a change with passage of time (aging) are small, a resonance signal can be detected without sweeping the input frequency to the atomic resonator at the time of a frequency unlock. Therefore, there is less degradation of the frequency stability at the time of alarm than a conventional rubidium atom oscillator, and a miniaturization and cost reduction can be achieved by omitting a sweep circuit.

Further, since the tuned data of the direct digital synthesizer is controlled to correct a fluctuation in the circumference temperature and a change in an amount of light of the rubidium lamp, the rubidium atom oscillator which is excellent in the temperature characteristic and the aging characteristic can be achieved.

Other objects, features and advantages of the present invention will become more apparent from the scope of the present invention when read in conjunction with the accompanying drawings.

DETAILED DESCRIPTION OF THE PREFERRED EMBODIMENT

First, a description will be given of a basic composition of a rubidium atom oscillator according to the present invention. The rubidium atom oscillator according to the present invention uses a crystal oscillator (XO) having a fixed output frequency and a direct digital synthesizer (DDS). The crystal oscillator (XO) hardly influenced by a circumference noise, and is excellent in a frequency deviation and frequency aging as compared to VCXO. Thereby, a short-term stability and phase noise characteristic are improved, and frequency stability degradation in a frequency unlock state is controlled to be minimum.

Figure 5:
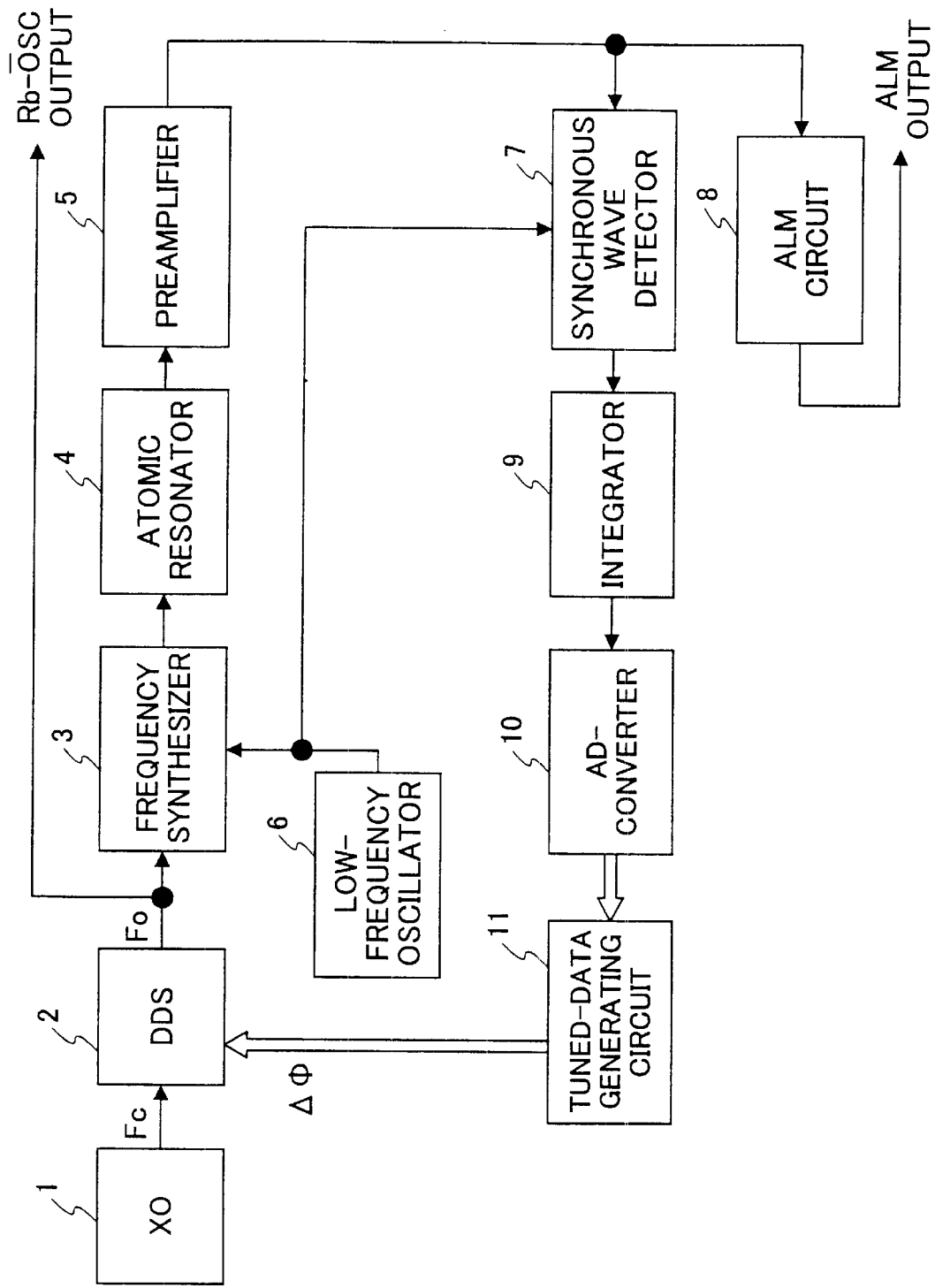
FIG. 5 is a block diagram of a rubidium atom oscillator according to an embodiment of the present invention.

FIG. 5 is a block diagram of a basic composition of the rubidium atom oscillator according to the present invention. As shown in FIG. 5, the rubidium atom oscillator according to the present invention comprises: a crystal oscillator (XO) 1 having a fixed output frequency; a direct digital synthesizer (hereinafter abbreviated as DDS) which inputs a frequency Fc output from XO 1, and generates an output frequency Fo based on a digital signal $\Delta\phi$ supplied by a tuned-data generating circuit 11 mentioned later; a frequency synthesizer 3 to which an analog-frequency Fo and an output of a low-frequency oscillator 6 are supplied so as to perform a frequency synthesis; an atomic resonator 4; a preamplifier 5; a low-frequency oscillator 6; a synchronous wave detector 7; an alarm (ALM) circuit 8; an integrator 9; an AD-converter 10; and a tuned-data generating circuit 11.

In FIG. 5, the fixed frequency Fc output from XO 1 is supplied to DDS 2 as a system clock. DDS 2 generates a signal of the analog frequency Fo according to the following relationship by being provided with tuned data (digital signal) $\Delta\phi$ from the tuned-data generating circuit has other inputs. The signal is supplied to the frequency synthesizer 3, and is output as an output signal of the rubidium atom oscillator. It should be noted that n is a number of bits of peculiar tuned data of DDS 2 (for example, 32 bits). The frequency synthesizer 3 synthesizes and multiplies the frequency Fo so as to generate the atomic resonance frequency, and applies a phase modulation based on the output signal of the low-frequency oscillator 6. The low frequency oscillator 6 is oscillated at a frequency of 100–200 Hz. The output of the frequency synthesizer 3 is supplied to the atomic resonator 4. The atomic resonator 4 operates according to the conventional composition so as to outputs a resonance signal to the preamplifier 5. The preamplifier 5 amplifies the resonance signal, and supplies the amplified resonance signal to the synchronous wave detector 7 and the alarm (ALM) circuit 8. The alarm circuit 8 outputs the alarm signal to outside when it is detected that there is no resonance signal.

Upon detection of a synchronous signal, the synchronous wave detector 7 supplies the synchronous signal to the integrator 9. The signal integrated by the integrator 9 is supplied to the AD-converter 10 as an error signal with respect to the signal at the time of resonance, and is converted into a digital signal. The digital signal is supplied to the tuned-data generating circuit 11, and is converted into temperature compensated tuned data $\Delta\phi$. The converted tuned data $\Delta\phi$ is supplied to DDS 2. Thereby, the output frequency of DDS 2 is stabilized at the atomic resonance frequency. In the above-mentioned composition, since XO 1 is not provided with any frequency variable element, an output frequency deviation and its change with respect to passage of time are small. Therefore, a resonance signal can be detected without sweeping the frequency input to the atomic resonator 4 at the time of a frequency unlock.

Thus, in the present invention, the output of the inexpensive and small fixed crystal oscillator (XO) is supplied to DDS, and the error signal is also supplied to DDS as tuned data. Thereby, the miniaturization of the atomic resonator is attained, and short-term stability and phase noise characteristic are improved. Moreover, frequency stability degradation in a frequency unlock state can be controlled to be minimum. In addition, in the above explanation, the crystal oscillator XO 1 is input to DDS2, and at the same time the tuned data from the tuned-data generating circuit 11 is supplied to DDS 2 as control data. Therefore, it can be appreciated that the "tuned data" can be referred to as "control data". Therefore, it is clear that the "tuned-data generating circuit", which-generates the "control data", can be referred to as "control data generating circuit".

Although the present invention is applicable to a case in which rubidium atoms are used for an atomic resonator, the present invention is also applicable to a case in which other atoms such as cesium atoms are used.

Figure 6:
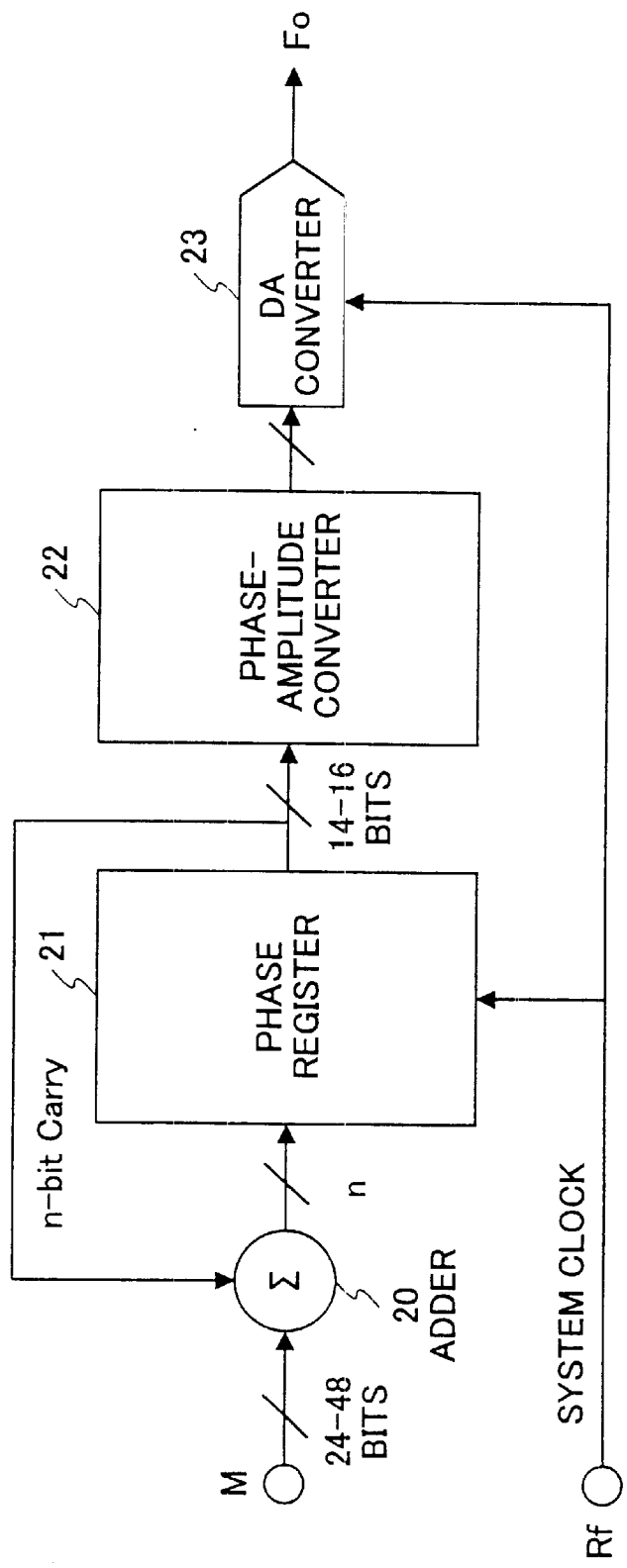
FIG. 6 is a block diagram of a direct digital synthesizer (DDS) system shown in FIG. 5.

Next, a description will be given, with reference to FIG. 6, of a direct digital synthesizer (DDS) system. FIG. 6 is a block diagram showing an example of the DDS system. In FIG. 6, an adder 20 sums a selection word M and an n bit carry. A phase register 21 generates a corresponding phase signal from a programmable read only memory (PROM) with respect to an n-bit signal. The phase-amplitude converter 22 converts an output of the phase register 21 into amplitude. The DA-converter 23 converts a digital signal from the phase-amplitude converter 22 into an analog signal. The adder 20 and the phase register 21 constitute a phase computer. Moreover, in FIG. 6, Fo is the output frequency of DDS 2, M is a binary selection word, Rf is a system clock, and n is a bit length of the phase computer. In the above-mentioned composition, the output frequency Fo is generated based on the relationship of the equation Fo=(M−Rf)/$2^n$. When using DDS shown in FIG. 6 as DDS 2 shown in FIG. 5, the digital signal Δφ from the tuned-data generating circuit 11 is input to DDS as the selection word M of the adder 20, and the frequency Fc generated by XO 1 is input to DDS as a system clock to the phase register 21 and the DA-converter 23. If the number of tuned-data bits of 50 MHz, the number of bits of the tuned data of DDS 2 is 32 bits (n bits), and the tuned data is 858993459, the output frequency Fo becomes the following value.

Fo=50 MHz×858993459/$2^{32}$=10 MHz

A description will now be given of an example of the tuned-data generating circuit (or control data generating circuit) 11 shown in FIG. 5, which generates tuned data (or control data) Δφ, which represents an error with respect to the atomic resonance frequency in DDS 2.

Figure 7:
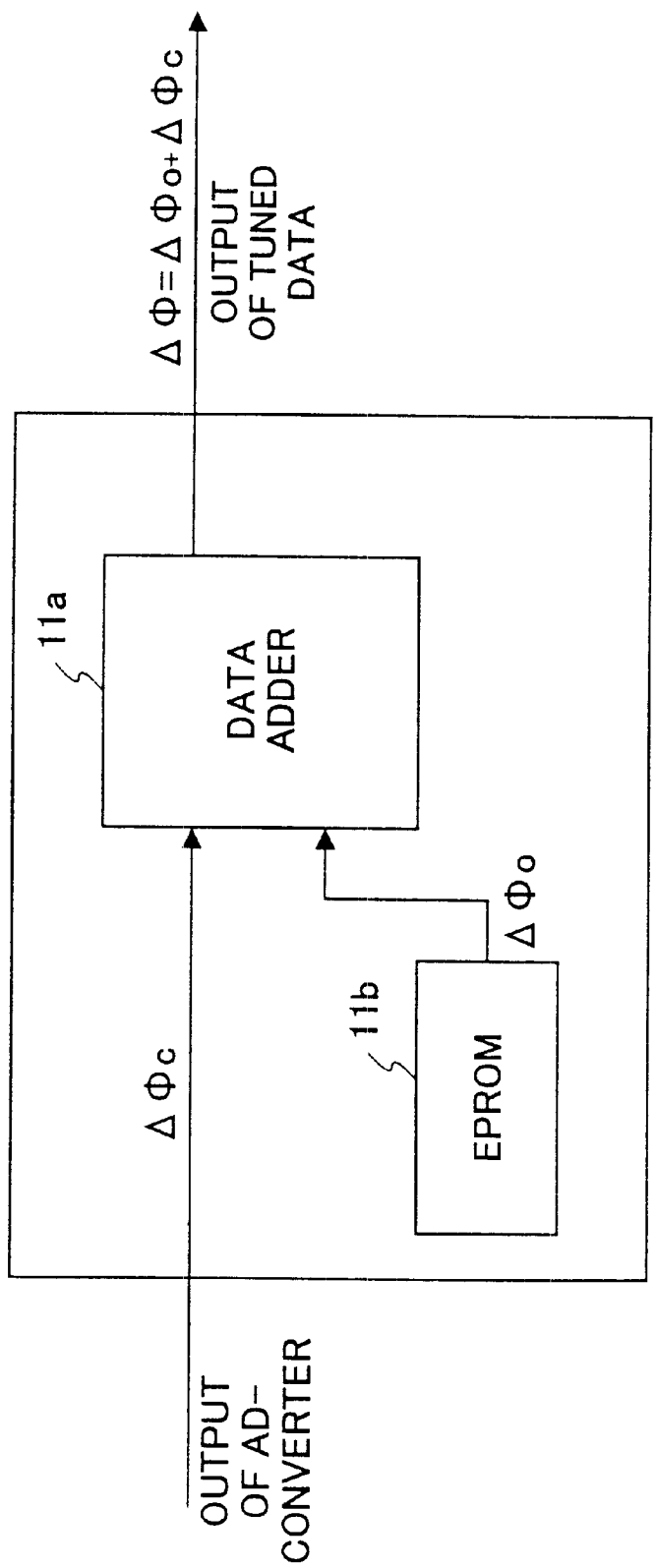
FIG. 7 is a circuit diagram of an example of a tuned-data generating circuit shown in FIG. 5.

FIG. 7 is a block diagram of the example of the tuned-data generating circuit. The tuned-data generating circuit shown in FIG. 7 comprises a data adder 11a and an erasable programmable read only memory (EPROM) 11b. Tuned data (referred to as $Δφ_o$) of DDS which generates the output frequency of a rubidium atom oscillator is stored in EPROM 11b beforehand. The data adder 11a sums the data output from EPROM 11b and the output (referred to as Δφc) of the AD-converter (10 of FIG. 5) having error information, and outputs the result as tuned data. Thereby, the tuned data is controlled so that the output frequency of DDS 2 shown in FIG. 5 follows the atomic resonance frequency, thereby stabilizing the output frequency of DDS 2.

In the atomic resonator 4 shown in FIG. 5, when rubidium atoms are used, the resonance frequency fluctuates since a temperature of each internal part is changed according to a change in an ambient temperature in which the atomic resonator is placed, although the lamp house having a rubidium lamp is maintained at 90° C. and the cavity resonator containing a resonance cell is maintained at 70° C. Moreover, although the output frequency of the atomic resonator changes with passage of time as described above, a major cause of the change is a decrease in an amount of light of the rubidium lamp. In the present invention, the tuned-data generating circuit is provided with means for preventing a fluctuation of the output frequency due to a change in the circumference temperature or a change with passage of time. Moreover, since it is desired to carry out a variable control of the output frequency of a rubidium atom oscillator from outside, the tuned-data generating circuit according to the present invention is provided with means for achieving such a variable control.

Figure 1:
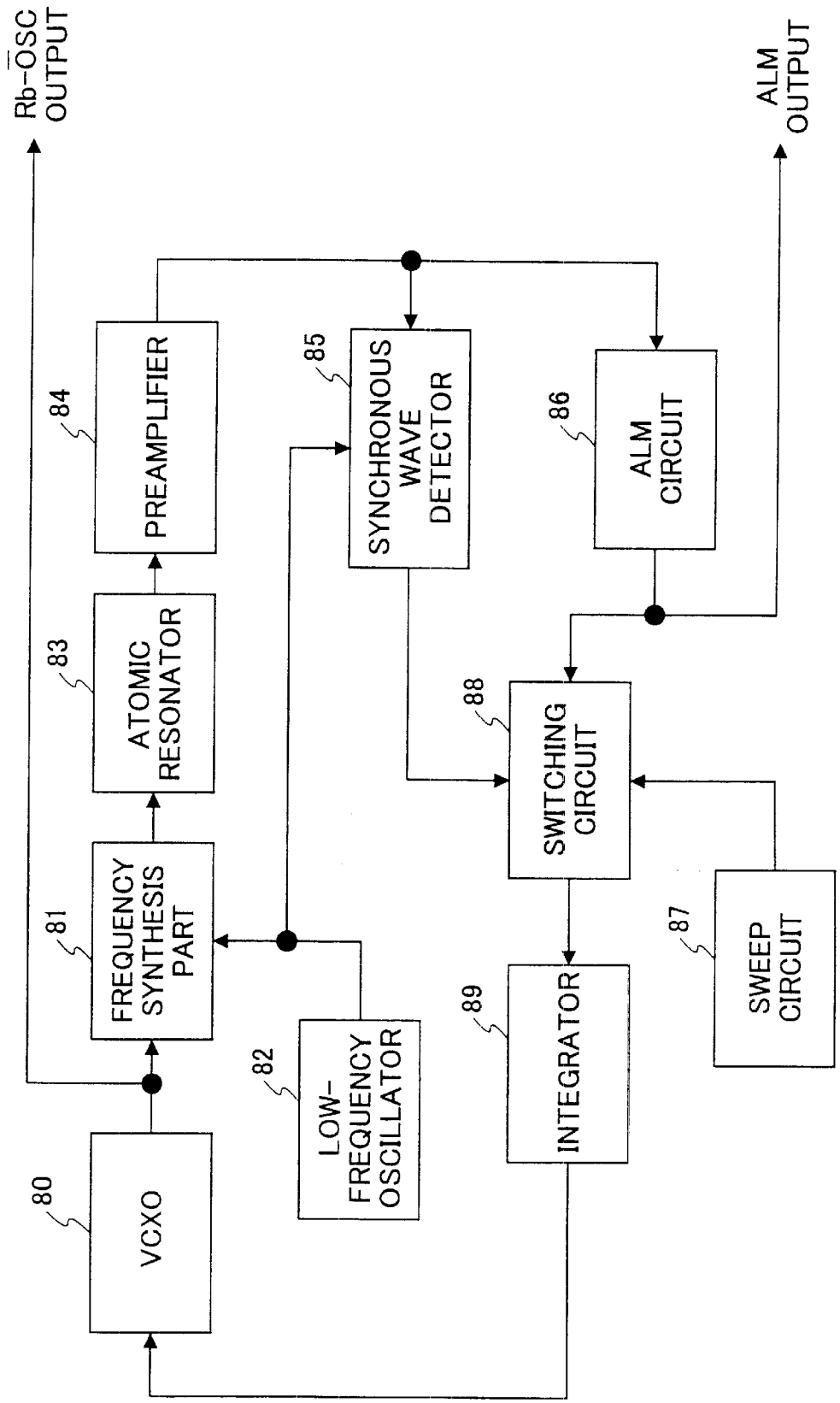
FIG. 1 is a block diagram of a conventional rubidium atom oscillator.
Figure 2:
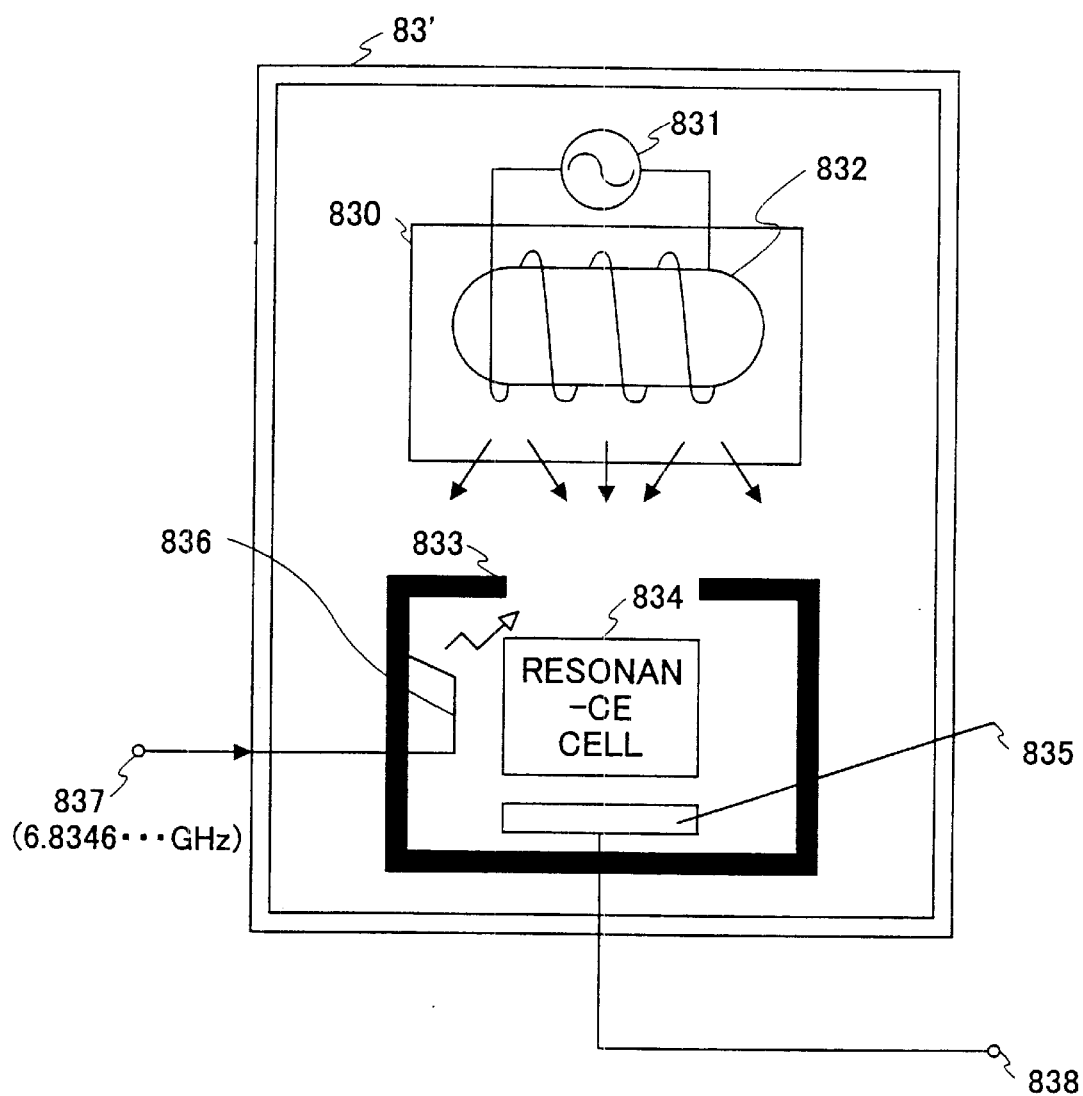
FIG. 2 is an illustration of an internal composition of an atomic resonator provided in the conventional rubidium atom oscillator.
Figure 3:
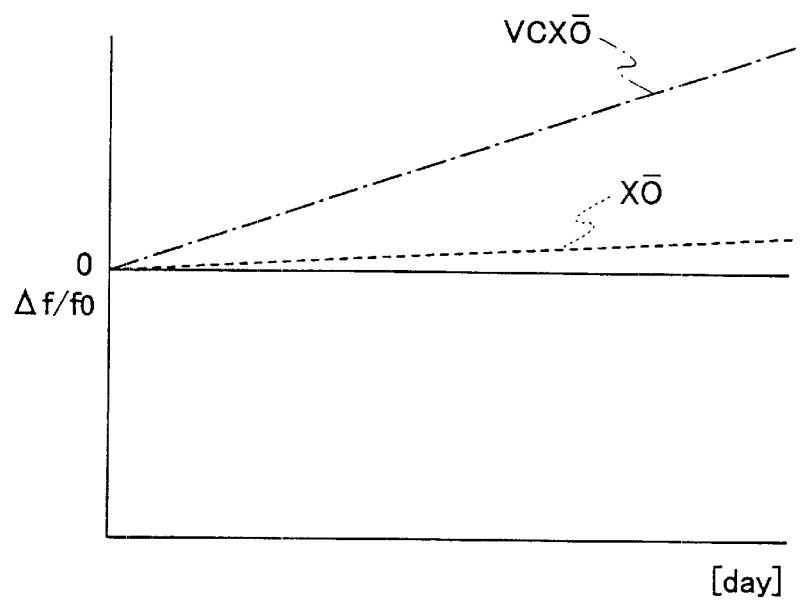
FIG. 3 is a graph showing changes in the characteristics of VCXO and XO with passage of time.
Figure 8:
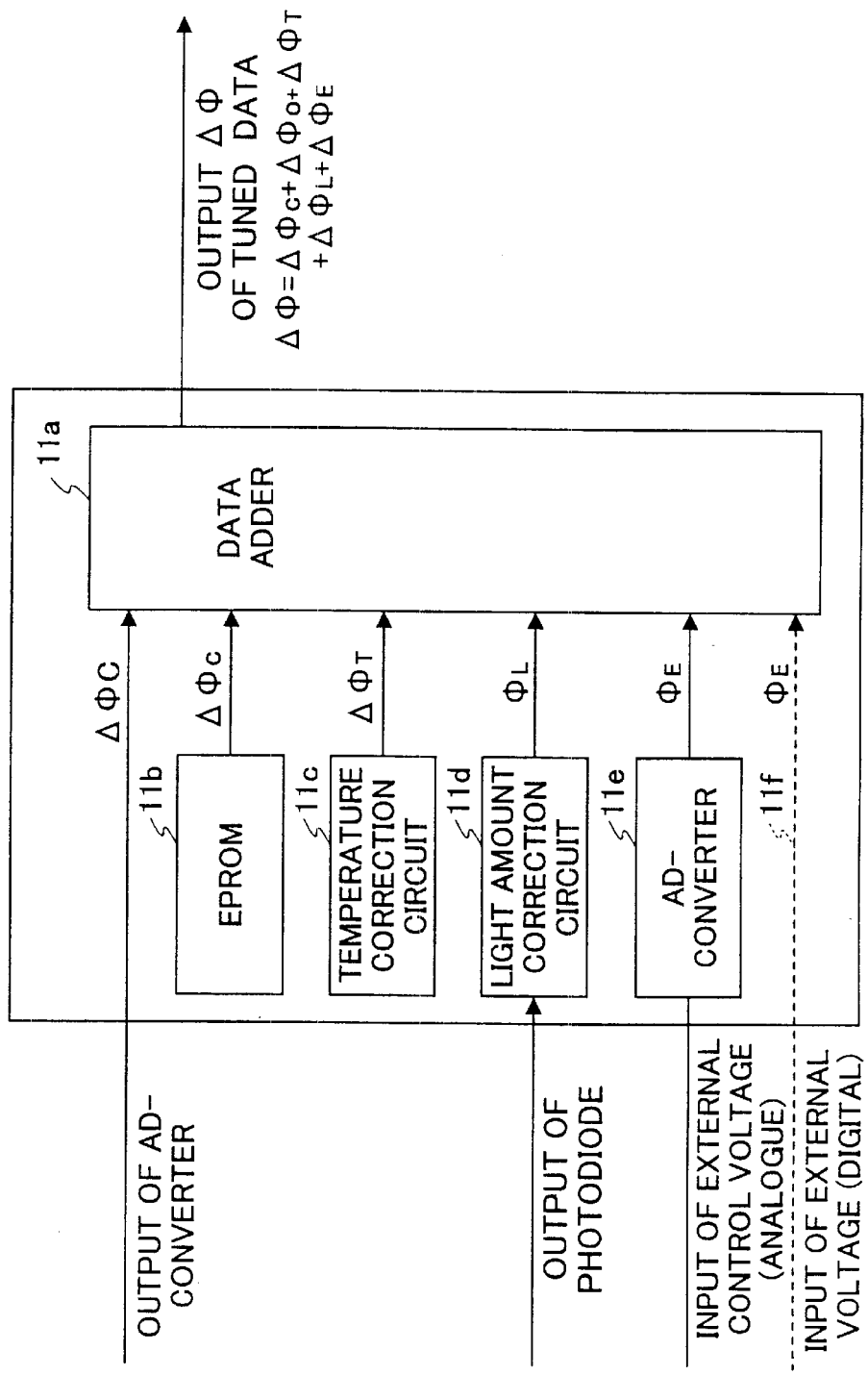
FIG. 8 is a circuit diagram of another example of the tuned-data generating circuit shown in FIG. 5.

FIG. 8 is a block diagram of another example of the tuned-data generating circuit. The tuned-data generating circuit shown in FIG. 8 prevents the frequency fluctuation due to the above-mentioned change in circumference temperature and the change with passage of time, and enables a variable control of the output frequency. In FIG. 8, parts that are the same as the parts shown in FIG. 7 are given the same reference numerals. In FIG. 8, a temperature correction circuit 11c carries out a correction by detecting the circumference temperature of the atomic resonator. The resonance signal from the photodiode (refer to FIG. 2) of the atomic resonator is input to a light amount correction circuit 11d. The light amount correction circuit 11d detects a change in an amount of light due to a change in the rubidium atoms of the atomic resonator with passage of time. An AD-converter 11e, is provided with an external control voltage so as to perform a variable control of the frequency. A dotted arrow indicated by 11f shows a case in which the external voltage input is a digital value. In this case, the digital value is directly input without using the AD-converter 11e. The tuned-data generating circuit shown in FIG. 7 has the composition in which the data $Δφ_o$ corresponding to the error output from the AD-converter (10 of FIG. 5) is supplied to the data adder 11a. The tuned-data generating circuit shown in FIG. 8 may have a structure in which: 1) any one of the temperature correction circuit 11c, light amount correction circuit 11d and the AD-converter 11e is added to the tuned-data generating circuit shown in FIG. 7; 2) a combination of any two of the temperature correction circuit 11c, light amount correction circuit 11d and the AD-converter 11e is added to the tuned-data generating circuit shown in FIG. 7; or 3) all of the aforementioned are added to the tuned-data generating circuit shown in FIG. 7.

A description will now be given below of a specific composition of each of the temperature correction circuit 11c and the light amount correction circuit 11d.

1) Composition in which the tuned-data generating circuit is provided with the temperature correction circuit:

The data $Δφ_o$ from the AD-converter (10 of FIG. 5) having error information, the tuned-data $Δφ_o$ of EPROM 111b, and the data $Δφ_T$ that changes with the circumference temperature from the temperature correction circuit 11c are input to the data adder 11a. By setting up the output of the temperature correction circuit so as to correct the frequency temperature characteristic of the rubidium atom oscillator, a frequency that is also stable with respect to a temperature change is output from DDS.

Figure 9:
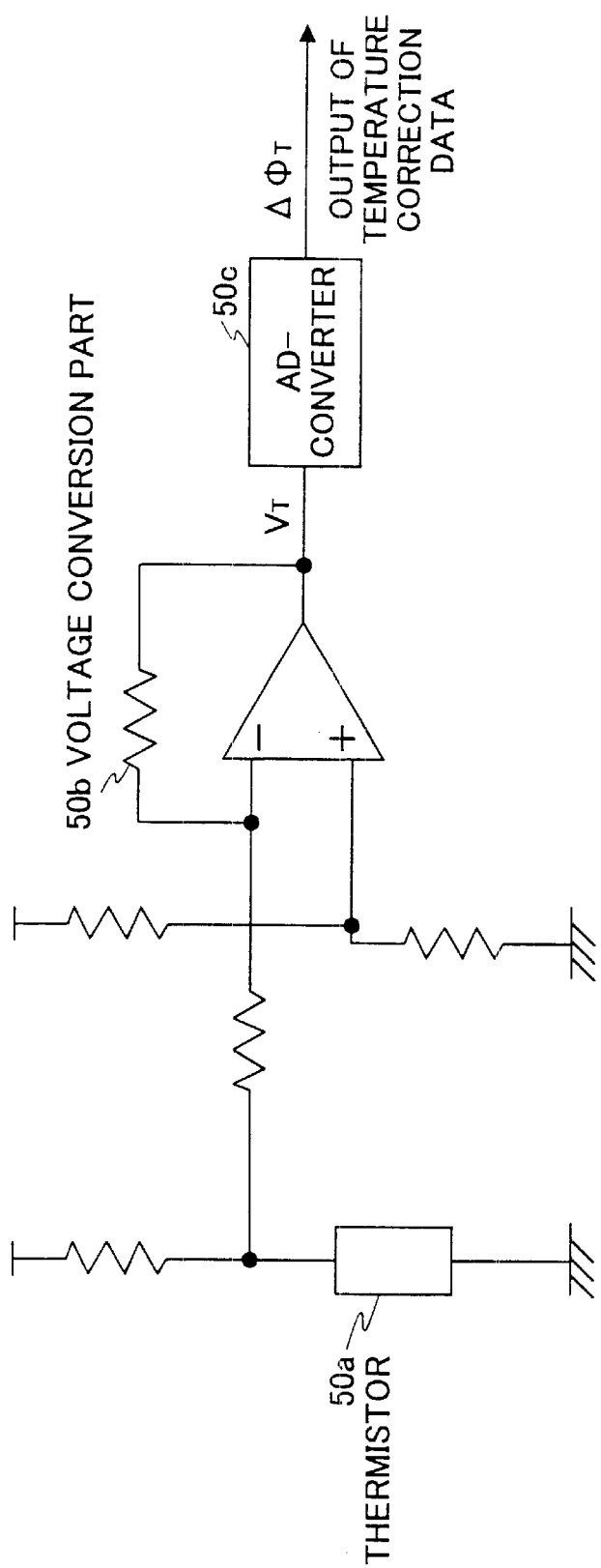
FIG. 9 is a circuit diagram of an example of a temperature correction circuit shown in FIG. 8.

FIG. 9 is a circuit diagram showing an example of the temperature correction circuit 11c. The temperature correction circuit shown in FIG. 9 comprises a thermistor 50a for detecting a circumference temperature, a voltage conversion part 50b and an AD-converter 50c. In this example, the thermistor 50a detects the circumference temperature of the atomic resonator as an electric current. The current of the thermistor 50a is converted into a proper voltage $V_T$ (analog voltage Vo which corrects frequency change of a rubidium atom oscillator due to temperature change) by the voltage conversion part 50b. The voltage $V_T$ is converted into digital data by the AD-converter 50c. The digital data is supplied to the data adder 11a shown in FIG. 7 as temperature correction data $Δφ_T$.

Figure 10:
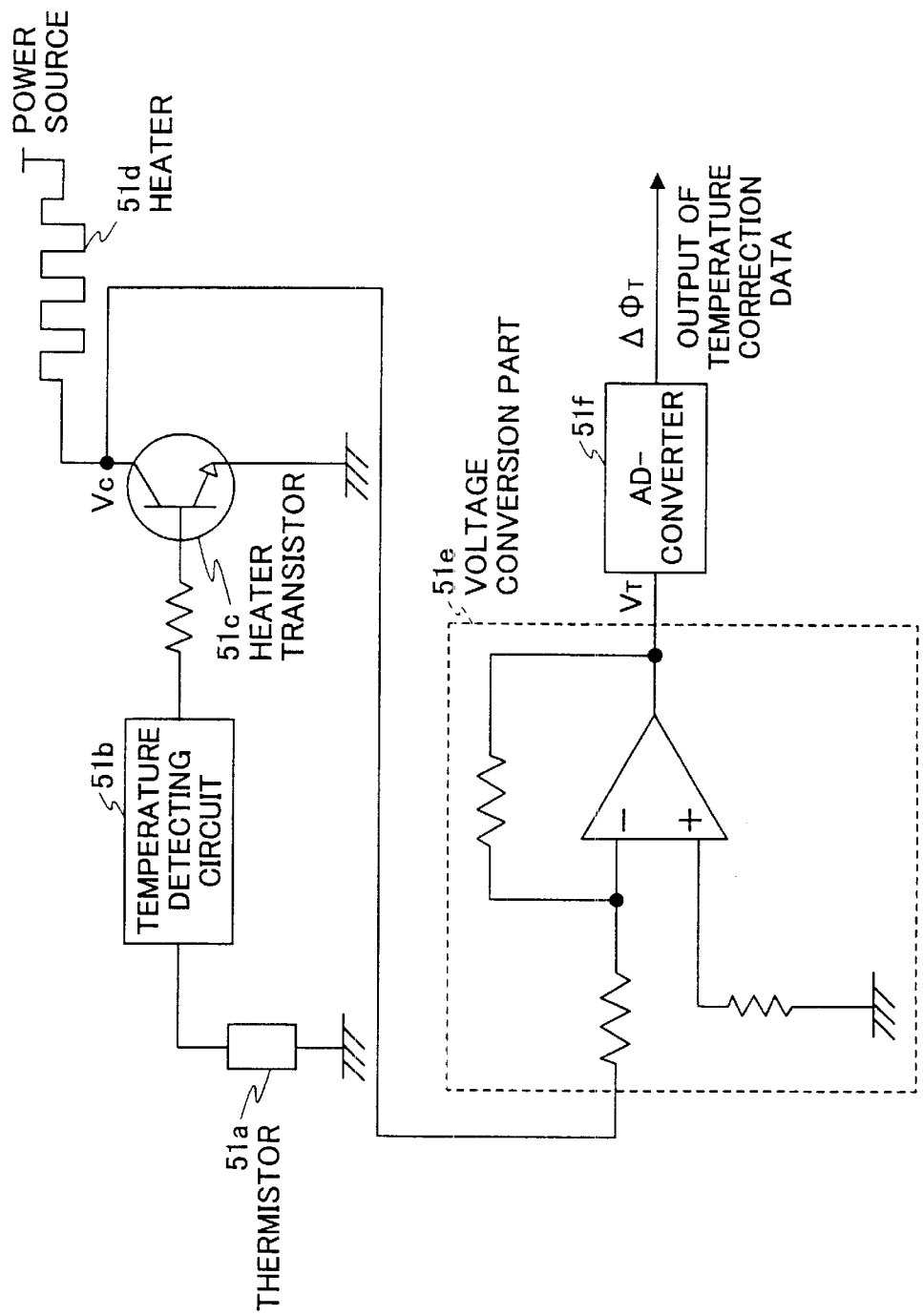
FIG. 10 is a circuit diagram of another example of the temperature correction circuit shown in FIG. 8.

FIG. 10 is a circuit diagram showing another example of the temperature correction circuit 11c. The temperature correction circuit shown in FIG. 10 comprises a thermistor 51a for detecting the circumference temperature, a temperature detection circuit 51b which converts a current of the thermistor 51a into a voltage, a heater transistor 51c, a heater 51d for heating the cavity and the lamp house of the atomic resonator, a voltage conversion part 51e, and an AD-converter 51f.

Temperature control is performed by the thermistor 51a, the temperature detection circuit 51b, the heater transistor 51c and the heater 51d. The voltage conversion part 51e and the AD-converter 51f together perform a temperature correction.

In FIG. 10, the heater 51 is driven by a heater current Ih which is provided for the temperature control of the lamp house and the cavity. A collector potential of the transistor 51c, which controls the heater current, changes with respect to a change in the circumference temperature, as shown in FIG. 11.

Figure 11:
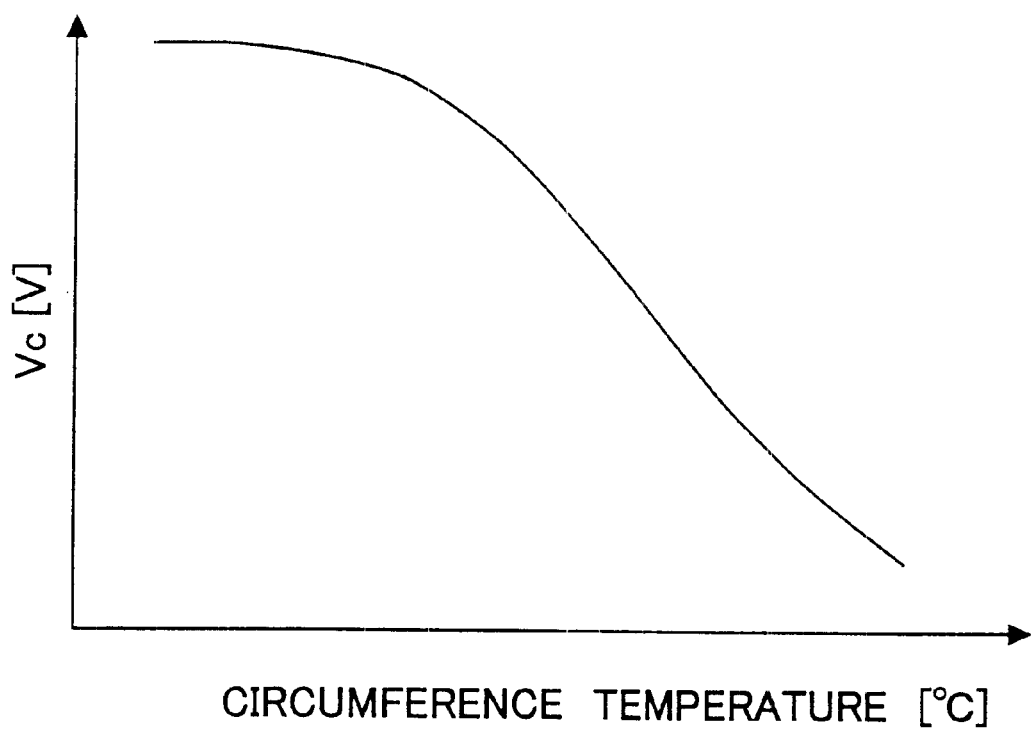
FIG. 11 is a graph showing a change in a collector potential of a heater transistor with respect to a change in a circumference temperature.

FIG. 11 shows a change in the collector potential Vc of the heater transistor 51c with respect to a change in the circumference temperature. In addition, it is assumed that the circumference temperature ranges from 0° C. to about 60° C. In this example a change in temperature is detected by the collector potential of the temperature control transistor of the atomic resonator without using a temperature-detecting element in the temperature correction circuit. The collector potential of the heater transistor 51c with respect to a circumference temperature is converted into a voltage, which corrects frequency change of a rubidium atom oscillator due to a change in temperature, by the voltage conversion part 51e. The AD-converter 51f converts the voltage into a digital signal, and the digital signal is output as the temperature correction data $\Delta\phi_o$.

2) Composition in which the light amount correction circuit (11d of FIG. 8) in the tuned-data generating circuit:

In order to cope with a decrease in an amount of light of the rubidium lamp of the atomic resonator, which is a major cause of a change in the output frequency in the rubidium atom oscillator with passage of time, a light amount correction circuit is used.

Figure 12:
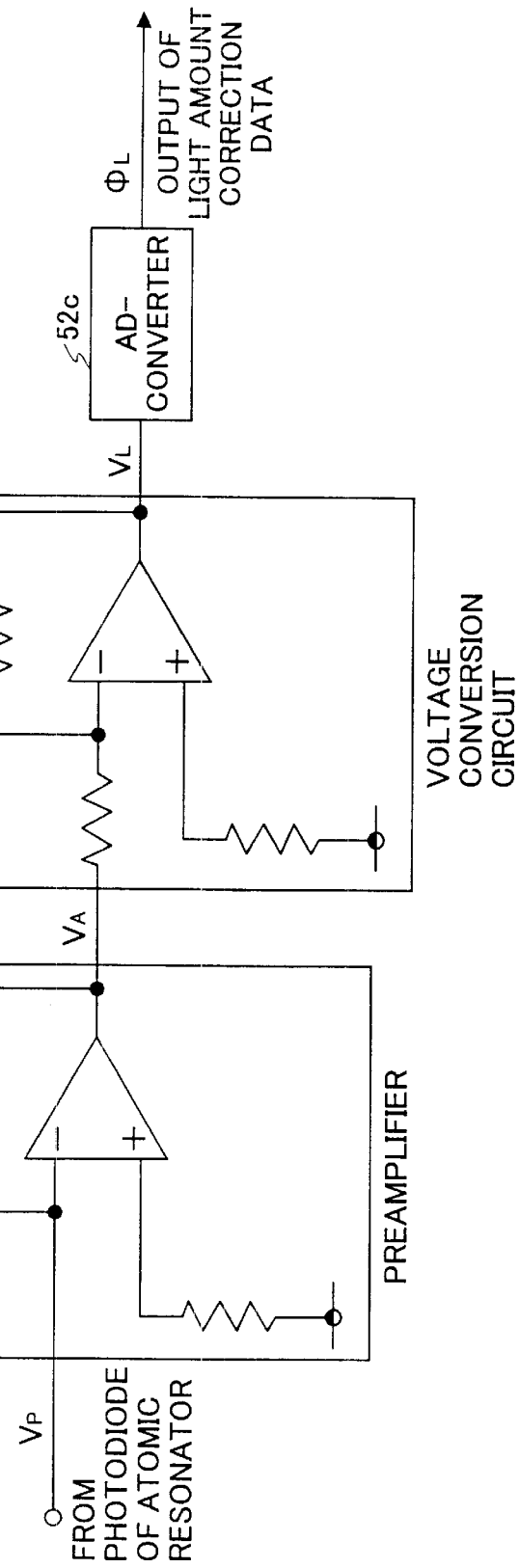
FIG. 12 is a circuit diagram of an example of a light amount correction circuit.

FIG. 12 is a circuit diagram of an example of a light amount correction circuit. The light amount correction circuit shown in FIG. 12 comprises a preamplifier 52a which amplifies a voltage Vp input from the photodiode of the atomic resonator, a voltage conversion circuit 52b and an AD-converter 52c. The output of the photodiode, which detects amount of light of the rubidium lamp in the atomic resonator, is input to the preamplifier 52a of the light amount correction circuit. The voltage conversion circuit 52b generates a voltage for as correcting the frequency change according to the output voltage of the preamplifier (that is, an amount of light of the rubidium lamp). After converting the output into a digital signal by the AD-converter 52c, the digital data is added as the tuned data of DDS (2 of FIG. 5) in the data adder (11a of FIG. 8). Thereby, DDS can generate a stable output frequency without frequency change due to a change in an amount of light. Both the light amount correction circuit (11d of FIG. 8) and the above-mentioned temperature correction circuit (11c of FIG. 8) are input to the data adder (11a of FIG. 8) and the EPROM (11b of FIG. 8). Thereby, both the temperature change of the output-frequency of the rubidium atom oscillator and the change with passage of time due to a decrease in an amount of light of the rubidium lamp can be corrected.

3) Composition in which a control voltage from outside is supplied to the tuned-data generating circuit:

By applying a control voltage from outside of the rubidium atom oscillator, the output frequency can be variable. That is, variable control rubidium oscillator (VCRO) can be constituted. After the control voltage of a direct current (analog) input from outside is converted into a digital signal by the AD-converter (11f of FIG. 8), the control voltage is input to the data adder. Therefore, the output frequency of DDS can be made variable by the external control voltage by supplying to DDS the output of the data adder as a tuned word.

Figure 4:
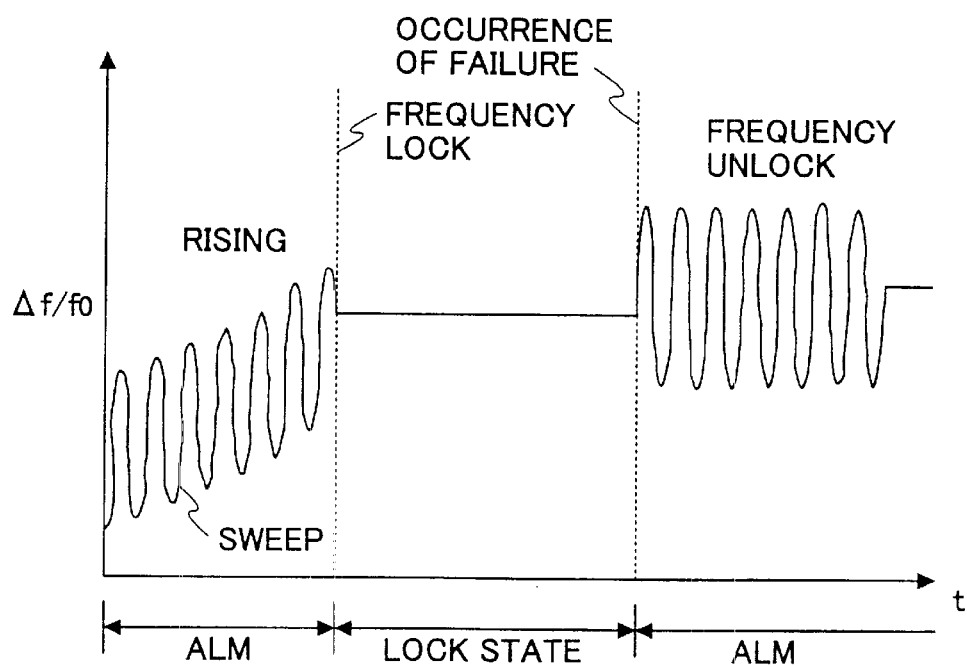
FIG. 4 is a graph showing the frequency change at the time of alarming and a frequency lock.

The output frequency can be made variable by supplying not an analog signal but the digital signal (11f of FIG. 4) as a signal for carrying out variable control of the frequency from the exterior of the rubidium atom oscillator. That is, a digital control rubidium oscillator (DCRO) can be constituted. After the digital signal input from outside is converted into suitable data directly or by the data conversion circuit, the data is input to the data adder (11a of FIG. 8). Therefore, the output frequency of DDS can be made variable by the external digital signal by supplying to DDS the output of the data adder as a tuned word.

As shown in FIG. 12, a temperature change of the output of the rubidium atom oscillator and the change with passage of time sue to a decrease in an amount of light of the rubidium lamp can be corrected, and the output frequency can be made variable by the control voltage from outside.

The present invention is not limited to the specifically disclosed embodiments, and variations and modifications may be made without departing from the scope of the present invention.

The present application is based on Japanese priority application No. 2001-064261 filed on Mar. 8, 2001, the entire contents of which are hereby incorporated by reference.

What is claimed is:

1. A rubidium atom oscillator comprising:
   a crystal oscillator which oscillates a fixed frequency as an atomic resonance frequency;
   a direct digital synthesizer which inputs an output of said crystal oscillator as a system clock and also inputs tuned data corresponding to an error signal generated according to a resonance frequency so as to carry out a variable control of an output frequency;
   a frequency synthesizer which synthesizes and multiplies an output of said direct digital synthesizer and applies a phase modulation with a low-frequency signal;
   an atomic resonator which inputs an output of said frequency synthesizer and detects an error signal with respect to a resonance frequency of rubidium atoms;
   a tuned-data generating circuit which inputs the error signal from said atomic resonator so as to generate the tuned data corresponding to the error signal,
   wherein the output frequency of said direct digital synthesizer is output from said rubidium atom oscillator.

2. The rubidium atom oscillator as claimed in claim 1, wherein said tuned-data generating circuit includes a data adder which inputs and sums a digital signal corresponding the error signal from said atomic resonator and an output signal of an erasable programmable read only memory that stores the tuned data output to said direct digital synthesizer so as to output the tuned data in which the error signal is reflected.

3. The rubidium atom oscillator as claimed in claim 2, further comprising a temperature correction circuit which generates a temperature correction signal for correcting a change in the resonance frequency of said atomic resonator based on a temperature detection signal representing a circumference temperature of said atomic resonator,
   wherein the temperature correction signal is input to said data adder of said tuned-data generating circuit.

4. The rubidium atom oscillator as claimed in claim 2, further comprising a temperature correction circuit which generates a temperature correction signal for correcting a change in the resonance frequency of said atomic resonator based on a temperature detection signal corresponding to a collector voltage of a transistor which controls an electric current supplied to a heater provided in said atomic resonator, wherein the temperature correction signal is input to said data adder of said tuned-data generating circuit.

5. The rubidium atom oscillator as claimed in claim 2, further comprising a light amount correction circuit which generates a light amount correction signal for correcting a change in the resonance frequency of said atomic resonator based on a light amount detection signal representing a change in an amount of light of a rubidium lamp provided in said atomic resonator with respect of passage of time, wherein the temperature correction signal is input to said data adder of said tuned-data generating circuit.

6. The rubidium atom oscillator as claimed in claim 2, wherein said data adder inputs a signal representing a variable control voltage from outside so that the tuned data output from said tuned-data generating circuit is variable to change the oscillation frequency of said rubidium atom oscillator.

7. The rubidium atom oscillator as claimed in claim 6, further comprising an analog-to-digital converter which converts the signal representing the variable control voltage into a digital signal and supplies the digital signal to said data adder.

8. The rubidium atom oscillator as claimed in claim 6, wherein the signal representing the variable control voltage is a digital signal so that the digital signal is directly supplied to said data adder.

9. A rubidium atom oscillator comprising:

a crystal oscillator which oscillates a fixed frequency as an atomic resonance frequency;

a direct digital synthesizer which inputs an output of said crystal oscillator as a system clock and also inputs control data corresponding to an error signal generated according to a resonance frequency so as to carry out a variable control of an output frequency;

an atomic resonator which inputs an output of said direct digital synthesizer after being subjected to a predetermined process and detects an error signal with respect to a resonance frequency of rubidium atoms;

a control-data generating circuit which inputs the error signal from said atomic resonator so as to generate the control data corresponding to the error signal, wherein the output frequency of said direct digital synthesizer is output from said rubidium atom oscillator.

* * * * *